(12) United States Patent
Lindsay

(10) Patent No.: US 7,153,741 B2
(45) Date of Patent: Dec. 26, 2006

(54) USE OF SELECTIVE EPITAXIAL SILICON GROWTH IN FORMATION OF FLOATING GATES

(75) Inventor: Roger W Lindsay, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 10/886,078

(22) Filed: Jul. 7, 2004

(65) Prior Publication Data
US 2006/0006451 A1    Jan. 12, 2006

(51) Int. Cl.
*H01L 21/336*    (2006.01)
(52) U.S. Cl. .................. 438/257; 438/488; 438/596
(58) Field of Classification Search ............. 438/257, 438/488, 596
See application file for complete search history.

(56) References Cited

U.S. PATENT DOCUMENTS

| 5,828,080 | A | 10/1998 | Yano |
| 6,559,008 | B1* | 5/2003 | Rabkin et al. ............. 438/257 |
| 6,743,695 | B1* | 6/2004 | Lee et al. .................. 438/439 |
| 6,777,741 | B1 | 8/2004 | Rabkin |
| 2004/0152260 | A1 | 8/2004 | Rabkin |

\* cited by examiner

*Primary Examiner*—Trung Dang
(74) *Attorney, Agent, or Firm*—Leffert Jay & Polglaze, P.A.

(57) ABSTRACT

Methods and apparatus utilizing epitaxial silicon growth on a base structure of a floating gate of a floating-gate memory cell to increase the available coupling area of the floating gate while reducing the spacing between adjacent memory cells. The epitaxial silicon growth facilitates a reduction in spacing between adjacent cells beyond the capability of the patterning technology, e.g., photolithography.

15 Claims, 9 Drawing Sheets

USE OF SELECTIVE EPITAXIAL SILICON GROWTH IN FORMATION OF FLOATING GATES

TECHNICAL FIELD OF THE INVENTION

The present invention relates generally to integrated circuit devices and, in particular, to the use of selective epitaxial silicon growth in the formation of floating gates for floating-gate transistors.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as Flash memory. A flash memory is a type of EEPROM (electrically-erasable programmable read-only memory) that generally can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed by charging the floating gate. The charge can be removed from the floating gate by a block erase operation. The data in a cell is determined by the presence or absence of the charge in the floating gate.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

Memory device fabricators are continuously seeking to increase productivity. One common approach is to place larger numbers of memory cells in a given amount of area, thus requiring smaller cells and/or closer spacing between cells. Smaller devices facilitate higher productivity and reduced power consumption. However, as device sizes become smaller, coupling area of the floating gate becomes increasingly critical. Additionally, it becomes increasingly difficult to reduce the spacing between adjacent floating gates.

For the reasons stated above, and for other reasons stated below which will become apparent to those skilled in the art upon reading and understanding the present specification, there is a need in the art for alternate methods and device structures for providing increased coupling area in a floating gate of a memory cell.

SUMMARY OF THE INVENTION

The above-mentioned problems with memory devices and other problems are addressed by the present invention and will be understood by reading and studying the following specification.

Various embodiments of the invention utilize epitaxial silicon growth on a base structure of a floating gate of a floating-gate memory cell to increase the available coupling area of the floating gate while reducing the spacing between adjacent memory cells. The epitaxial silicon growth facilitates a reduction in spacing between adjacent cells beyond the capability of the patterning technology, e.g., photolithography.

For one embodiment, the invention provides a method of fabricating a floating gate for a floating-gate memory cell. The method includes forming an extension of epitaxial silicon on a base structure, wherein the floating gate comprises the base structure and the extension of epitaxial silicon. For a further embodiment, the base structure contains one or more layers of a silicon-containing material. For a still further embodiment, the base structure contains one or more layers of polysilicon.

For another embodiment, the invention provides a floating-gate memory cell containing a floating gate having a silicon-containing base layer and an extension of epitaxial silicon formed on the silicon-containing base layer.

The invention further provides methods and apparatus of varying scope.

DETAILED DESCRIPTION OF THE INVENTION

In the following detailed description of the preferred embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and their equivalents.

Figure 1A:
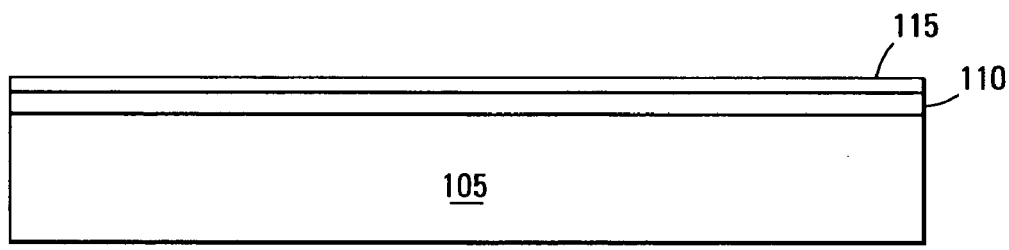
FIGS. 1A–1I are cross-sectional views of a portion of a memory array during various stages of fabrication in accordance with an embodiment of the invention.

FIGS. 1A–1I generally depict a method of forming a portion of a memory array in accordance with an embodiment of the invention. FIG. 1A depicts a portion of the memory array after several processing steps have occurred. Formation of the type of structure depicted in FIG. 1A is well known and will not be detailed herein. In general, FIG. 1A depicts a substrate 105 upon which sacrificial layers 110 and 115 have been formed. For one embodiment, the substrate 105 is a monocrystalline silicon substrate. For a further embodiment, substrate 105 is a P-type monocrystalline silicon substrate.

The sacrificial layers 110 and 115 will function as a hard mask during subsequent processing. For one embodiment, the first sacrificial layer 110 is an oxide layer. Oxide layer 110 could be formed, for example, through a thermal oxidation of a silicon-containing substrate 105. For one embodiment, the second sacrificial layer 115 is a silicon nitride layer. Silicon nitride layer 115 could be formed, for example, through a chemical vapor deposition (CVD) of a silicon nitride material.

Figure 1B:
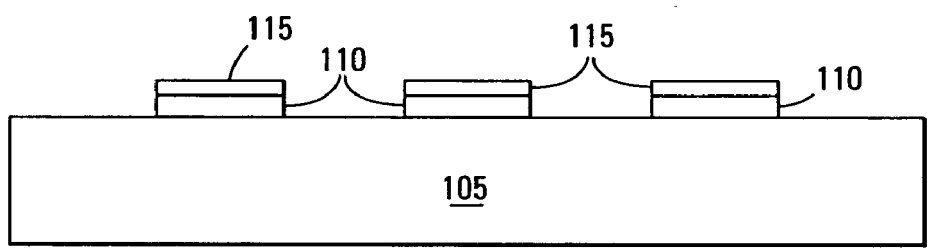

In FIG. 1B, the hard mask, i.e., sacrificial layers 110 and 115 are patterned. Patterning of such layers is well understood and will not be detailed herein. As one example, in a photolithographic process, a resist layer could be formed overlying the layers 110 and 115 and subsequently exposed and developed to produce a mask exposing portions of the layers 110 and 115. The exposed portions of the layers 110 and 115 could then be removed, such as by etching, to produce the structure of FIG. 1B.

Figure 1C:
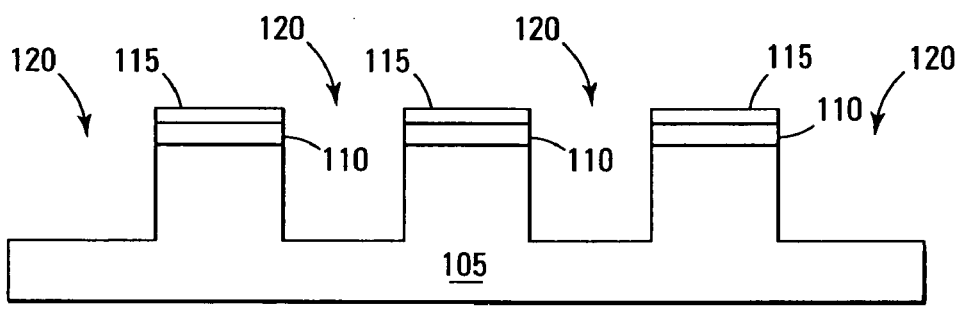
Figure 1D:
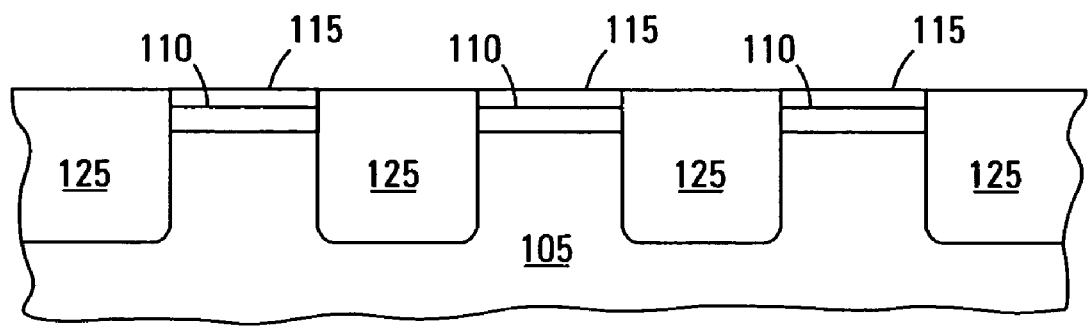

In FIG. 1C, portions of the substrate 105 exposed upon the removal of portions of the layers 110 and 115 are removed to define trenches 120 for future isolation regions. In FIG. 1D, the trenches 120 are filled with one or more dielectric materials, e.g., silicon dioxide and any excess is planarized, such as by chemical mechanical planarization (CMP), using the layer 115 as a stopping layer. This results in isolation regions 125 interposed between the areas of the substrate 105 covered by the layers 110 and 115. Such isolation, often referred to as shallow trench isolation (STI) is well known.

Figure 1E:
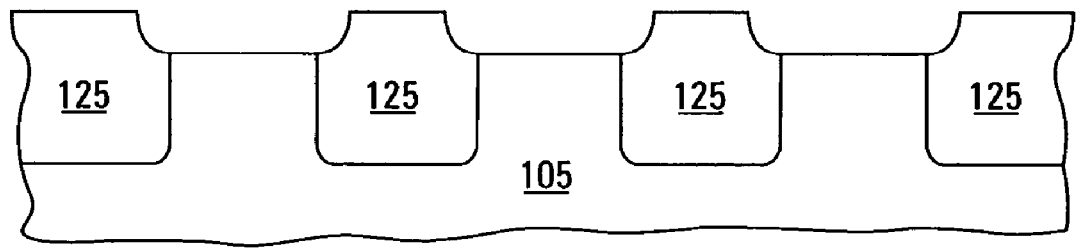

In FIG. 1E, the sacrificial layers 110 and 115 are removed. As one example, a silicon oxide strip can first be performed to ensure that the silicon nitride layer 115 is devoid of any silicon oxide material left after the CMP process. The silicon nitride layer 115 is then removed, such as by etching. The oxide layer 110 is subsequently removed, such as by etching. Upon removal of the sacrificial layers 110 and 115, the structure of FIG. 1E may be obtained. For the example materials described with reference to this embodiment, it is expected that the corners of the isolation regions 125 will be recessed upon the removal of the layers 110 and 115.

Figure 1F:
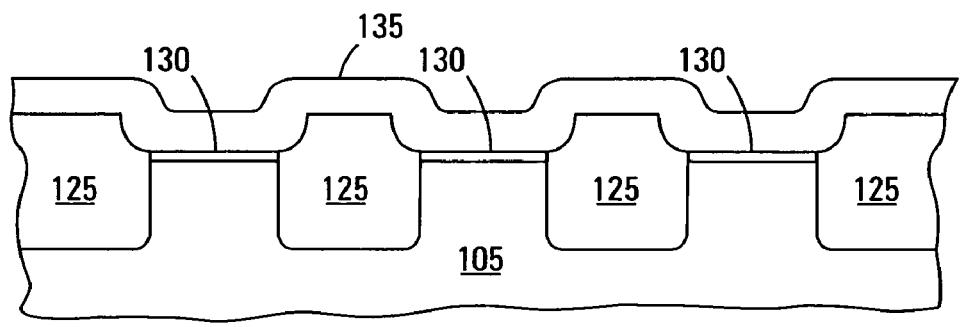

In FIG. 1F, a tunnel dielectric layer 130 is formed on the substrate 110. The tunnel dielectric layer 130 might be formed by thermal oxidation of the silicon substrate 105, forming the structure as depicted in FIG. 1F. Alternatively, the tunnel dielectric layer 130 could be formed by a blanket deposition of a dielectric material, such as by CVD or physical vapor deposition (PVD). Tunnel dielectric layer 130 is generally a silicon oxide, but may include other dielectric materials. Some specific examples include silicon oxides ($SiO/SiO_2$), silicon nitrides ($SiN/Si_2N/Si_3N_4$) and silicon oxynitrides ($SiO_xN_y$).

Figure 1G:
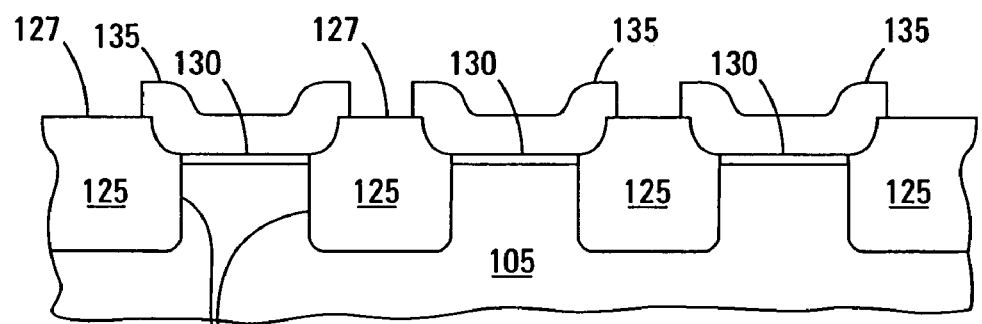

A base structure upon which nucleation for epitaxial silicon growth will be favored in then formed overlying the tunnel dielectric layer 130. This base structure is preferably a silicon-containing layer, e.g., polysilicon layer 135. However, other materials capable of storing a charge could be used provided epitaxial silicon growth on the base structure would be the predominant reaction over any growth on the isolation regions 125. For the embodiment depicted in FIG. 1F, the polysilicon layer 135 may be conductively doped. An example would be an n-type polysilicon layer. In FIG. 1G, the polysilicon layer 135 is patterned to define future floating gates. The polysilicon layers 135 may extend past sidewalls 126 of adjacent isolation regions 125. The polysilicon layers 135 may further extend across an upper surface 127 of adjacent isolation regions 125.

Figure 1H:
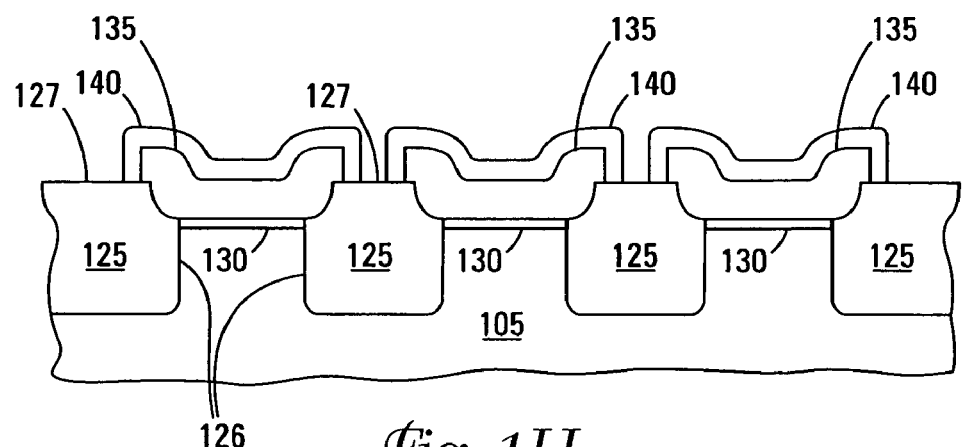

In FIG. 1H, an epitaxial silicon growth, or deposition, is performed. Epitaxial silicon growth will be selective to areas of exposed silicon, such as the base structure of the future floating gates, or polysilicon layer 135. The epitaxial silicon will grow both horizontally and vertically from the exposed portions of polysilicon layer 135. Such selective growth will produce the extensions of epitaxial silicon 140 while leaving exposed portions of the isolation regions 125 substantially devoid of any silicon growth. The polysilicon layer 135 and extensions of epitaxial silicon 140 form the floating gate of a memory cell. For one embodiment, the extensions of epitaxial silicon 140 will extend past the sidewalls 126 and across the upper surfaces 127 of adjacent isolation regions 125 by a distance greater than the underlying polysilicon layers 135. Thus, the extensions of epitaxial silicon 140 serve to both increase the available coupling area of the floating gate while reducing the spacing between adjacent cells, thereby making more efficient use of available semiconductor real estate.

Epitaxial deposition of silicon is a chemical vapor deposition (CVD) process. The process will replicate the structure of the silicon material upon which it is formed. For example, if the base structure is of monocrystalline silicon, the epitaxial growth will maintain the same monocrystalline structure. Similarly, if the base structure is of polycrystalline silicon (polysilicon), the epitaxial growth will likewise be polysilicon. Silicon precursors are transported to, and adsorbed on, the exposed silicon structures. Common silicon precursors for the production of epitaxial silicon include silicon tetrachloride ($SiCl_4$), trichlorosilane ($SiHCl_3$), dichlorosilane ($SiH_2Cl_2$) and silane ($SiH_4$).

The process of epitaxial silicon growth is well understood in the art. Typical deposition temperatures range from about 600° C. to about 1250° C. Depth of the epitaxial growth is typically controlled through reaction time, or time that the silicon structures are exposed to the reactant gases and their reaction conditions. Typical reaction times may range from about 1 minute to about 15 minutes or more, depending upon the desired depth of deposition.

Selective epitaxial deposition occurs when silicon atoms having high surface mobility are deposited from the silicon source or precursor. These silicon atoms migrate to sites on exposed silicon structures, where nucleation is favored. Others have observed that silicon mobility is enhanced by the presence of halides in the reaction gases. Other factors recognized to enhance the selective nature of the silicon deposition include reduced reaction pressure, increased reaction temperature and decreased mole fraction of silicon in the reaction gases.

For one embodiment, the epitaxial silicon growth is undoped during formation. For another embodiment, the epitaxial silicon growth is doped during formation. Doping of the epitaxial silicon growth can be used to alter the conductive properties of the resulting silicon layer, to reduce the temperature of formation or to otherwise alter the properties of the resulting material. The dopants, or impurities, are added to the reaction gases during the epitaxial silicon growth. Doping epitaxial growth is typically carried out by adding hydrides of the dopant materials to the reaction gases. For example, diborane (B2H6) may be added to the reaction gases to form a boron-doped monocrystalline silicon.

Figure 1I:
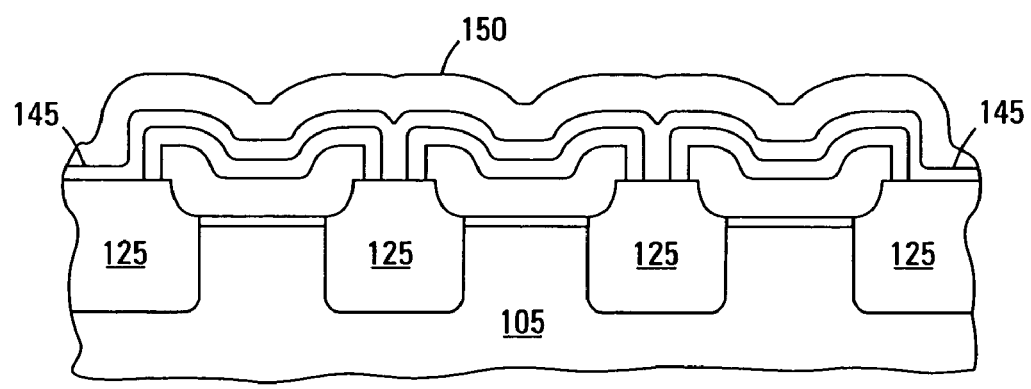

In FIG. 1I, an intergate dielectric layer 145 is formed over the extensions of epitaxial silicon 140. Intergate dielectric layer 120 contains one or more layers of dielectric material. For one embodiment, the dielectric layer 120 contains the dielectric ONO (oxide-nitride-oxide). Other dielectric materials may be substituted for the ONO, such as tantalum oxide, barium strontium titanate, silicon nitride and other materials providing dielectric properties. A control gate layer 150 is formed overlying the intergate dielectric layer 145 and patterned to define word lines of the memory device. The control gate layer 150 is generally one or more layers of conductive material. For one embodiment, the control gate layer 150 contains a conductively-doped polysilicon. For a further embodiment, the control gate layer 150 includes a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, the control gate layer 150 contains multiple metal-containing layers, e.g., a titanium nitride (TiN) barrier layer overlying the intergate dielectric layer 145, a titanium (Ti) adhesion layer overlying the barrier layer and a tungsten (W) layer overlying the adhesion layer. An insulative cap layer (not shown) is often formed overlying the control gate layer 150 to protect and isolate the control gate from further processing.

It is noted that FIGS. 1A–1I depict a portion of a row of memory cells running parallel to a face plane of the drawings. Columns of memory cells, separated by the isolation regions 125 run perpendicular to the drawings, with source and drain regions formed at opposing ends of the tunnel dielectric layer 130, one above the face plane of the figures and one below the face plane of the figures. It is noted that FIGS. 1A–1I can depict either a NOR-type memory device or a NAND-type memory device, with the differences occurring in the column direction in manners that are well understood in the art of memory fabrication.

Figure 2A:
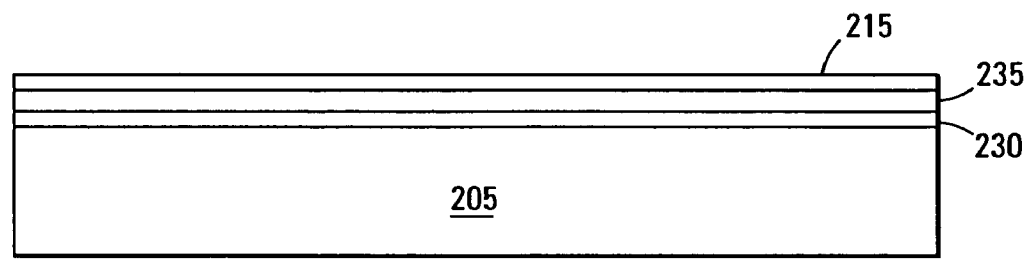
FIGS. 2A–2G are cross-sectional views of a portion of a memory array during various stages of fabrication in accordance with another embodiment of the invention.

FIGS. 2A–2G generally depict a method of forming a portion of a memory array in accordance with another embodiment of the invention. FIG. 2A depicts a portion of the memory array after several processing steps have occurred. Formation of the type of structure depicted in FIG. 2A is well known and will not be detailed herein. In general, FIG. 2A depicts a substrate 205 upon which a tunnel dielectric layer 230, a polysilicon layer 235 and a sacrificial layer 215 are formed. For one embodiment, the substrate 205 is a monocrystalline silicon substrate. For a further embodiment, substrate 205 is a P-type monocrystalline silicon substrate.

The formation and material guidance for the sacrificial layer 215 are generally the same as for the sacrificial layers 110 and 115 of FIG. 1A. The sacrificial layer 215 will function as a hard mask during subsequent processing. The formation and material guidance for the tunnel dielectric layer 230 are the same as for the tunnel dielectric layer 130 of FIG. 1F and the formation and material guidance for the layer 235 are the same as for the layer 135 of FIG. 1F.

Figure 2B:
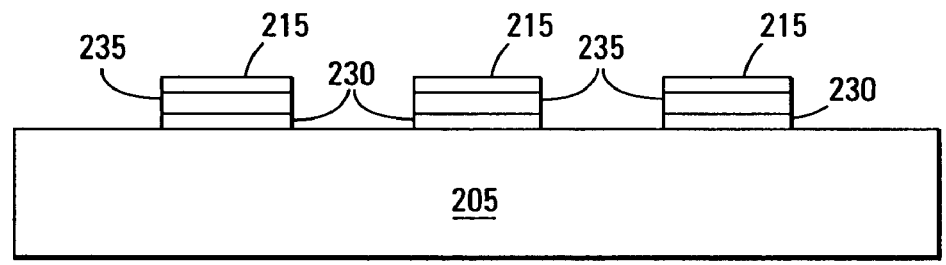

In FIG. 2B, the hard mask, i.e., sacrificial layer 215 is patterned along with the tunnel dielectric layer 230 and the polysilicon layer 235. Patterning of such layers is well understood and will not be detailed herein.

Figure 2C:
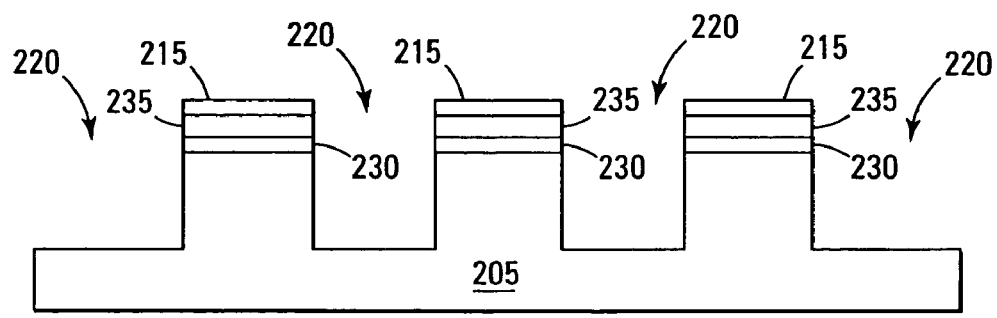

In FIG. 2C, portions of the substrate 205 exposed upon the removal of portions of the layers 230, 235 and 215 are removed to define trenches 220 for future isolation regions.

Figure 2D:
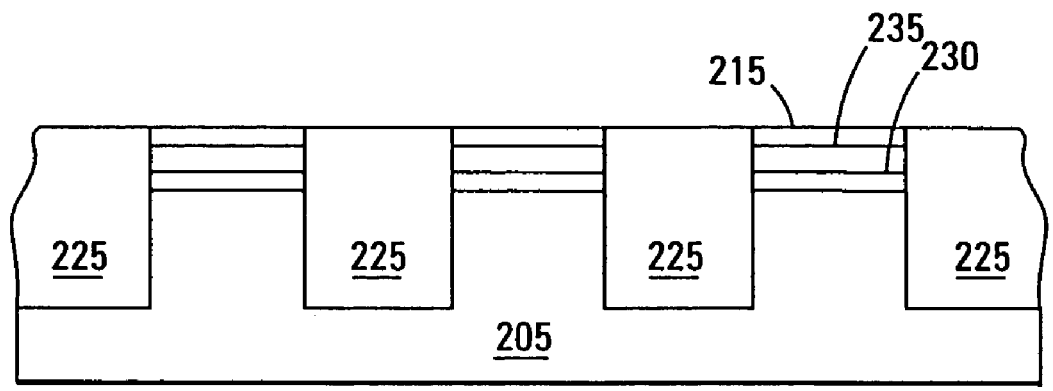

In FIG. 2D, the trenches 220 are filled with one or more dielectric materials, e.g., silicon dioxide and any excess is planarized, such as by chemical mechanical planarization (CMP), using the layer 215 as a stopping layer. This results in isolation regions 225 interposed between the areas of the substrate 205 covered by the layers 230, 235 and 215. Such isolation, often referred to as shallow trench isolation (STI) is well known.

Figure 2E:
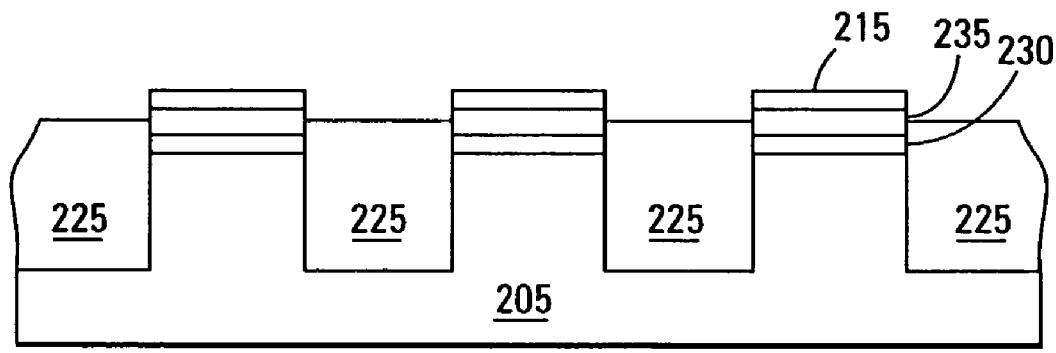
Figure 2F:
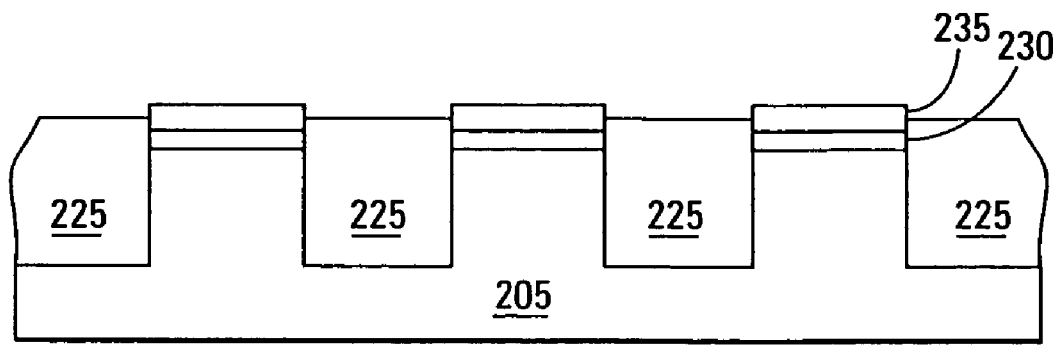

In FIG. 2E, a silicon oxide strip can first be performed to ensure that the silicon nitride layer 215 is devoid of any silicon oxide material left after the CMP process. The silicon nitride layer 215 is then removed in FIG. 2F, such as by etching.

Figure 2G:
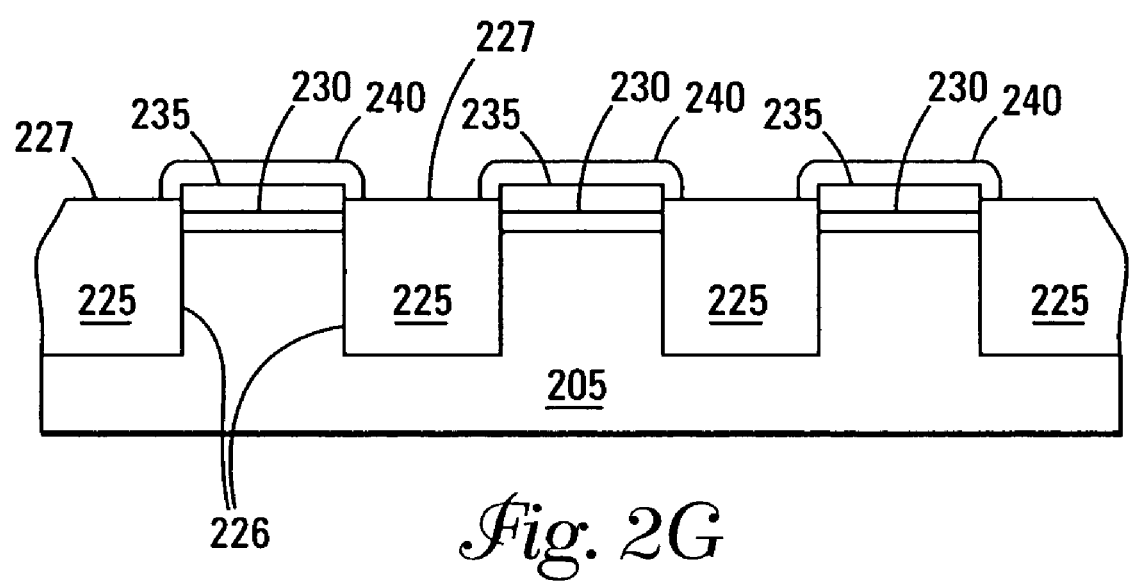

In FIG. 2G, an epitaxial silicon growth, or deposition, is performed. Epitaxial silicon growth will be selective to areas of exposed silicon, such as the base structure of the future floating gates, or polysilicon layer 235. The epitaxial silicon will grow both horizontally and vertically from the exposed portions of polysilicon layer 235. Such selective growth will produce the extensions of epitaxial silicon 240 while leaving exposed portions of the isolation regions 225 substantially devoid of any silicon growth. For one embodiment, the extensions of epitaxial silicon 240 will extend past the sidewalls 226 and across the upper surfaces 227 of adjacent isolation regions 225 while the underlying polysilicon layers 235 may be substantially flush with the sidewalls 226 of the adjacent isolation regions 225. The polysilicon layer 235 and extensions of epitaxial silicon 240 form the floating gate of a memory cell. Subsequent processing of the memory device can proceed as described with reference to FIG. 1I, forming the intergate dielectric layer, the control gate layer and the source/drain regions.

It is noted that FIGS. 2A–2G depict a portion of a row of memory cells running parallel to a face plane of the drawings. Columns of memory cells, separated by the isolation regions 225 run perpendicular to the drawings. It is noted that FIGS. 2A–2G can depict either a NOR-type memory device or a NAND-type memory device, with the differences occurring in the column direction in manners that are well understood in the art of memory fabrication.

Figure 3A:
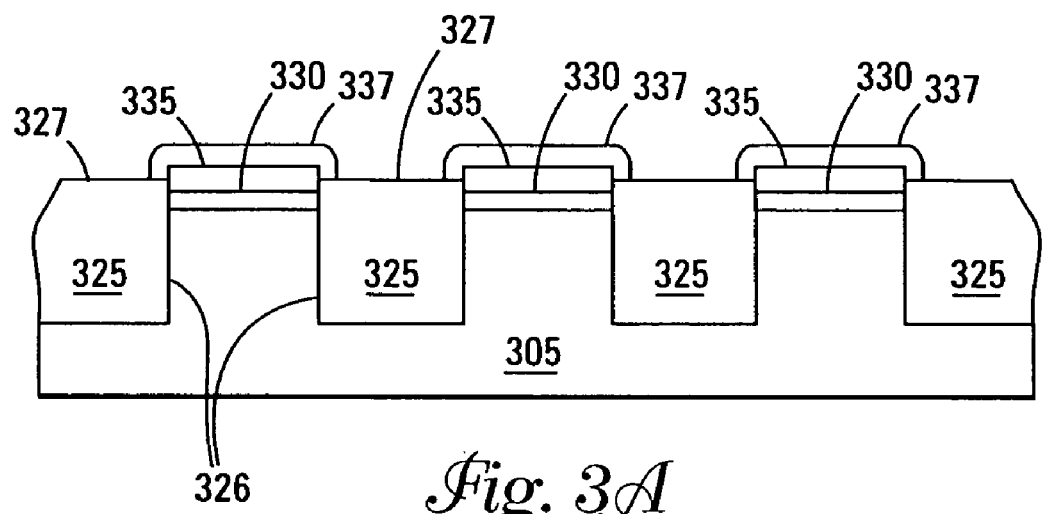
FIGS. 3A–3B are cross-sectional views of a portion of a memory array during various stages of fabrication in accordance with a further embodiment of the invention.
Figure 3B:
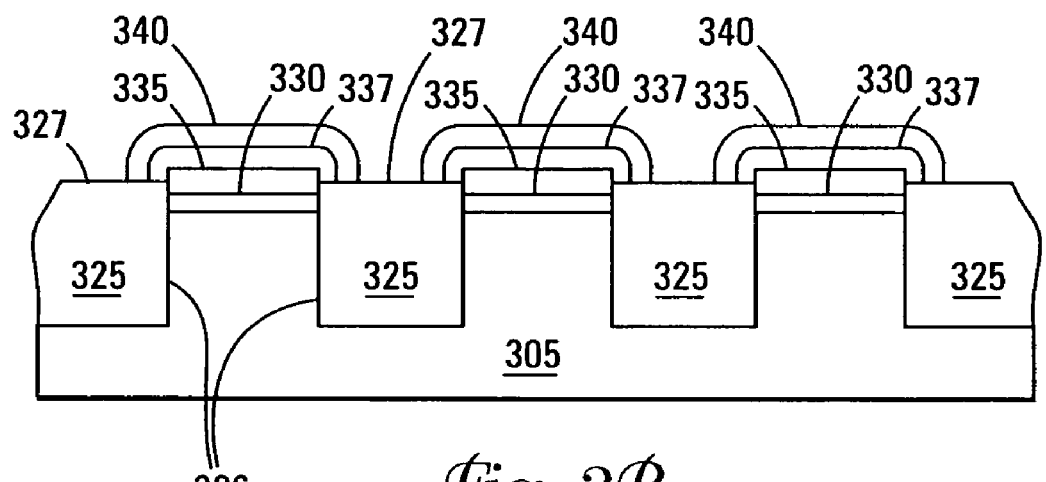

FIGS. 3A–3B generally depict a method of forming a portion of a memory array in accordance with a further embodiment of the invention. FIG. 3A depicts a portion of the memory array after several processing steps have occurred. Formation of the type of structure depicted in FIG. 3A is a modification of the process as described with reference to FIGS. 2A–2F. In general, FIG. 3A depicts a substrate 305, isolation regions 325, tunnel dielectric layer 330 and polysilicon layer 335. It will be apparent that this structure can be formed in accordance with the process described with reference to FIGS. 2A–2F. In addition, a second polysilicon layer 337 is formed and patterned overlying the polysilicon layer 335. For one embodiment, the second polysilicon layer 337 extends past the sidewalls 326 and across the upper surfaces 327 of adjacent isolation regions 325 while the underlying first polysilicon layer 335 may be substantially flush with the sidewalls 326 of the adjacent isolation regions 325. This serves to increase the area of the base structure upon which epitaxial silicon will be grown, thereby providing for increased coupling area of the floating gate for a given extent of epitaxial silicon growth.

In FIG. 3B, an epitaxial silicon growth, or deposition, is performed. Epitaxial silicon growth will be selective to areas of exposed silicon, such as the base structure of the future floating gates, or polysilicon layer 337. The epitaxial silicon will grow both horizontally and vertically from the exposed portions of polysilicon layer 337 to produce the extensions of epitaxial silicon 340 while leaving exposed portions of the isolation regions 325 substantially devoid of any silicon growth. For one embodiment, the extensions of epitaxial silicon 340 will extend past the sidewalls 326 and across the upper surfaces 327 of adjacent isolation regions 325 while the underlying polysilicon layers 325 may be substantially flush with the sidewalls 326 of the adjacent isolation regions 325. The polysilicon layer 335, second polysilicon layer 337 and extensions of epitaxial silicon 340 form the floating gate of a memory cell. Subsequent processing of the memory device can proceed as described with reference to FIG. 11, forming the intergate dielectric layer, the control gate layer and the source/drain regions.

It is noted that FIGS. 3A–3B depict a portion of a row of memory cells running parallel to a face plane of the drawings. Columns of memory cells, separated by the isolation regions 325 run perpendicular to the drawings. It is noted that FIGS. 3A–3B can depict either a NOR-type memory device or a NAND-type memory device, with the differences occurring in the column direction in manners that are well understood in the art of memory fabrication.

Figure 4:
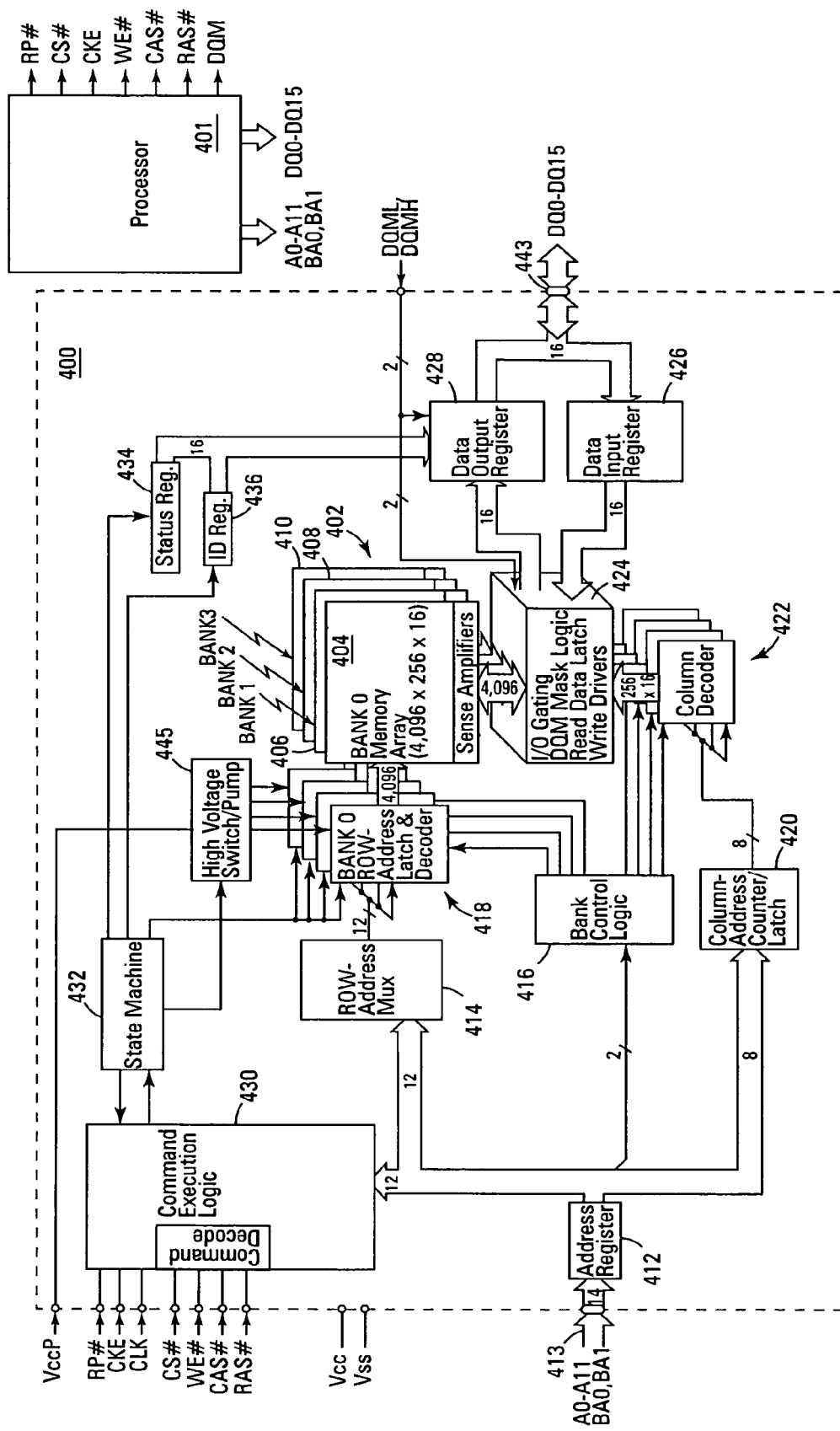
FIG. 4 is a functional block diagram of a basic memory device in accordance with an embodiment of the invention coupled to a processor.

FIG. 4 is a functional block diagram of a basic flash memory device 400 that is coupled to a processor 401. The memory device 400 and the processor 401 may form part of an electronic system. The memory device 400 has been simplified to focus on features of the memory that are helpful in understanding the present invention. The memory device 400 includes an array of non-volatile memory cells 402.

Each memory cell is located at an intersection of a word line and a local bit line. The memory array 402 is arranged in rows and columns, with the rows arranged in blocks. A memory block is some discrete portion of the memory array 402. Individual word lines generally extend to only one memory block while bit lines may extend to multiple memory blocks. The memory cells generally can be erased in blocks. Data, however, may be stored in the memory array 402 separate from the block structure.

The memory array 402 is arranged in a plurality of addressable banks. In one embodiment, the memory contains four memory banks 404, 406, 408 and 410. Each memory bank contains addressable sectors of memory cells. The data stored in the memory can be accessed using externally provided location addresses received by address register 412 from processor 401 on address lines 413. The addresses are decoded using row address multiplexer circuitry 414. The addresses are also decoded using bank control logic 416 and row address latch and decode circuitry 418.

To access an appropriate column of the memory, column address counter and latch circuitry 420 couples the received addresses to column decode circuitry 422. Circuit 424 provides input/output gating, data mask logic, read data latch circuitry and write driver circuitry. Data is input through data input registers 426 and output through data output registers 428. This bidirectional data flow occurs over data (DQ) lines 443.

Command execution logic 430 is provided to control the basic operations of the memory device including memory read operations. A state machine 432 is also provided to control specific operations performed on the memory arrays and cells. A high voltage switch and pump circuit 445 is provided to supply higher voltages during erase and write operations. A status register 434 and an identification register 436 can also be provided to output data.

The memory device 400 can be coupled to an external memory controller, or processor 401, to receive access commands such as read, write and erase command. Other memory commands can be provided, but are not necessary to understand the present invention and are therefore not outlined herein. The memory device 400 includes power supply inputs Vss and Vcc to receive lower and upper voltage supply potentials.

As stated above, the flash memory device 400 has been simplified to facilitate a basic understanding of the features of the memory device. A more detailed understanding of flash memories is known to those skilled in the art. As is well known, such memory devices 400 may be fabricated as integrated circuits on a semiconductor substrate.

CONCLUSION

Methods and apparatus have been described utilizing epitaxial silicon growth on a base structure of a floating gate of a floating-gate memory cell to increase the available coupling area of the floating gate while reducing the spacing between adjacent memory cells. The epitaxial silicon growth facilitates a reduction in spacing between adjacent cells beyond the capability of the patterning technology, e.g., photolithography.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of fabricating a floating gate for a floating-gate memory cell, comprising:
    forming isolation regions in a semiconductor substrate and exposing portions of the semiconductor substrate between adjacent isolation regions;
    forming a tunnel dielectric layer on the exposed portions of the semiconductor substrate;
    forming and patterning a base structure overlying the tunnel dielectric layer and extending past sidewalls of the adjacent isolation regions; and
    forming an extension of epitaxial silicon on the base structure, wherein the floating gate comprises the base structure and the extension of epitaxial silicon.

2. The method of claim 1, wherein forming and patterning the base structure overlying the tunnel dielectric layer and extending past sidewalls of the adjacent isolation regions further comprises forming and patterning a polysilicon layer on the tunnel dielectric layer and on portions of the adjacent isolation regions.

3. The method of claim 1, wherein forming and patterning the base structure overlying the tunnel dielectric layer and extending past sidewalls of the adjacent isolation regions further comprises forming and patterning a first polysilicon layer on the tunnel dielectric layer and forming and patterning a second polysilicon layer on the first polysilicon layer and on portions of the adjacent isolation regions.

4. The method of claim 1, further comprising:
doping the epitaxial silicon concurrently with forming the extension.

5. A method of fabricating a floating-gate memory cell, comprising:
forming a first dielectric layer on a semiconductor substrate between isolation regions;
forming a polysilicon layer on the first dielectric layer and extending past sidewalls of the isolation regions;
growing epitaxial silicon on the polysilicon layer, wherein the polysilicon layer and epitaxial silicon growth form a floating-gate layer;
forming a second dielectric layer on the floating-gate layer; and
forming a conductive layer on the second dielectric layer.

6. A method of fabricating a floating-gate memory cell, comprising:
forming at least one sacrificial layer on a semiconductor substrate;
patterning the at least one sacrificial layer to expose first portions of the substrate;
removing the exposed first portions of the substrate to define trenches;
filling the trenches with dielectric material, thereby defining isolation regions;
removing the patterned at least one sacrificial layer to expose second portions of the substrate;
forming a tunnel dielectric layer on the exposed second portions of the substrate;
forming a first layer of conductive material on the tunnel dielectric layer;
patterning the first layer of conductive material such that the patterned first layer of conductive material extends past sidewalls of the isolation regions;
forming epitaxial silicon on the patterned first layer of conductive material;
forming an intergate dielectric layer overlying the epitaxial silicon;
forming a control gate layer overlying the intergate dielectric layer; and
patterning the control gate layer.

7. The method of claim 1, wherein forming an extension of epitaxial silicon on the base structure further comprises forming the extension of epitaxial silicon to extend past sidewalls of the isolation regions by a distance greater than the base structure extends past the sidewalls of the isolation regions.

8. A method of fabricating a floating gate for a floating-gate memory cell, comprising:
forming isolation regions in a semiconductor substrate and exposing portions of the semiconductor substrate between adjacent isolation regions:
forming a tunnel dielectric layer on the exposed portions of the semiconductor substrate;
forming and patterning a polysilicon layer on the tunnel dielectric layer and extending past sidewalls of the adjacent isolation regions, thereby defining a base structure;
forming an extension of epitaxial silicon on a base structure, wherein the floating gate comprises the base structure and the extension of epitaxial silicon; and
doping the epitaxial silicon concurrently with forming the extension.

9. A method of fabricating a floating gate for a floating-gate memory cell, comprising:
forming and patterning a first polysilicon layer on a tunnel dielectric layer located between adjacent isolation regions;
forming and patterning a second polysilicon layer on the first polysilicon layer and extending past sidewalls of the adjacent isolation regions, wherein the first and second polysilicon layers define a base structure;
forming an extension of epitaxial silicon on the base structure, wherein the floating gate comprises the base structure and the extension of epitaxial silicon; and
doping the epitaxial silicon concurrently with forming the extension.

10. The method of claim 5, wherein growing epitaxial silicon on the polysilicon layer further comprises growing the epitaxial silicon to extend past the sidewalls of the isolation regions by a distance greater than the polysilicon layer extends past the sidewalls of the isolation regions.

11. The method of claim 5, further comprising conductively doping the epitaxial silicon.

12. The method of claim 5, further comprising conductively doping the polysilicon layer.

13. The method of claim 6, wherein forming a first layer of conductive material on the tunnel dielectric layer further comprises forming a layer a conductively-doped polysilicon on the tunnel dielectric layer.

14. The method of claim 13, wherein forming a layer of conductively-doped polysilicon further comprises forming a layer of polysilicon and conductively doping the layer of polysilicon after formation.

15. The method of claim 6, wherein forming epitaxial silicon on the patterned first layer of conductive material further comprises forming epitaxial silicon on the patterned first layer of conductive material and conductively doping the epitaxial silicon during formation.

* * * * *